United States Patent
Kataoka et al.

(10) Patent No.: US 12,170,193 B2
(45) Date of Patent: Dec. 17, 2024

(54) TEMPERATURE ESTIMATION APPARATUS, PLASMA PROCESSING SYSTEM, TEMPERATURE ESTIMATION METHOD AND TEMPERATURE ESTIMATION PROGRAM

(71) Applicant: Tokyo Electron Limited, Tokyo (JP)

(72) Inventors: Yuki Kataoka, Hokkaido (JP); Hiroshi Nagahata, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 520 days.

(21) Appl. No.: 17/445,967

(22) Filed: Aug. 26, 2021

(65) Prior Publication Data
US 2022/0068602 A1    Mar. 3, 2022

(30) Foreign Application Priority Data

Sep. 3, 2020  (JP) ................... 2020-148524
Aug. 25, 2021  (JP) ................... 2021-137303

(51) Int. Cl.
*H01J 37/32*   (2006.01)
*G01K 13/00*   (2021.01)

(52) U.S. Cl.
CPC .......... *H01J 37/3299* (2013.01); *G01K 13/00* (2013.01); *H01J 2237/24585* (2013.01)

(58) Field of Classification Search
CPC ......... H01J 37/3299; H01J 2237/24585; H01J 37/32522; G01K 13/00; G01K 7/427; G01K 7/42; H01L 21/67069; H01L 21/3065; H01L 21/67248; H01L 21/67253; G05D 23/20
See application file for complete search history.

(56) References Cited

U.S. PATENT DOCUMENTS

| | | | |
|---|---|---|---|
| 9,831,065 B2* | 11/2017 | Fong | H01J 37/32183 |
| 2009/0310645 A1* | 12/2009 | Kofuji | G01K 13/00 702/136 |
| 2016/0378092 A1* | 12/2016 | Yamamoto | G05B 19/404 700/300 |

FOREIGN PATENT DOCUMENTS

JP    2019-212852    12/2019

* cited by examiner

*Primary Examiner* — Mohammad K Islam
(74) *Attorney, Agent, or Firm* — IPUSA, PLLC

(57) ABSTRACT

A temperature estimation apparatus includes an estimation unit configured to successively estimate temperature data by successively inputting given time series process data relating to conditions inside a processing space in which plasma processing is performed, into a time series model generated in advance that correlates data values, in each time period, of time series process data relating to conditions inside the processing space, with a data value, at a respective time point, of time series temperature data measured inside the processing space.

10 Claims, 11 Drawing Sheets

TEMPERATURE ESTIMATION APPARATUS, PLASMA PROCESSING SYSTEM, TEMPERATURE ESTIMATION METHOD AND TEMPERATURE ESTIMATION PROGRAM

BACKGROUND OF THE INVENTION

1. Field of the Invention

The disclosures herein relate to a temperature estimation apparatus, a plasma processing system, a temperature estimation method, and a temperature estimation program.

2. Description of the Related Art

In semiconductor fabrication processes, ensuring the quality of wafers after plasma treatment requires keeping temperature within a predetermined range inside a processing space. However, in the case of semiconductor fabrication processes, it is not feasible to install a temperature sensor inside a processing space for direct measurement of temperature inside the processing space. Indirect means to obtain temperature inside a processing space, such as through estimation, is thus desired.

As an example, Patent Document 1 and the like disclose a method of estimating temperature inside a processing space by using process conditions for plasma processing. According to this estimation method, acquiring process conditions prior to the start of plasma processing allows temperature inside a processing space during the plasma processing to be estimated.

However, even in the case of using the same process conditions, a change in conditions inside the processing space (such as a temperature increase or decrease at the start of plasma processing, or an increase in the temperature of parts inside the processing space during the plasma processing) may occur, and may lead to lowering in the accuracy of temperature estimation.

The disclosures herein are aimed at providing a temperature estimation apparatus, a plasma processing system, a temperature estimation method, and a temperature estimation program which estimate temperature responsive to a change in conditions inside a processing space for plasma processing.

RELATED-ART DOCUMENTS

Patent Document

[Patent Document 1] Japanese Laid-open Patent Publication No. 2019-212852

SUMMARY OF THE INVENTION

A temperature estimation apparatus according to an embodiment of the present disclosures includes an estimation unit configured to successively estimate temperature data by successively inputting given time series process data relating to conditions inside a processing space in which plasma processing is performed, into a time series model generated in advance that correlates data values, in each time period, of time series process data relating to conditions inside the processing space, with a data value, at a respective time point, of time series temperature data measured inside the processing space.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

In the following, embodiments will be described with reference to the accompanying drawings. In the specification and drawings, elements having substantially the same functions or configurations are referred to by the same numerals, and a duplicate description thereof will be omitted.

First Embodiment

<System Configuration of Plasma Processing System>

A description will be given first with respect to the system configuration of a plasma processing system to which a temperature estimation apparatus according to a first embodiment is applied. In the first embodiment, the temperature estimation apparatus has a function performed during a model generation phase and a function performed during an estimation phase. In the following, plasma processing systems to which temperature estimation apparatuses performing these respective functions are applied, respectively, will be described separately.

(1) System Configuration of Plasma Processing System to which Temperature Estimation Apparatus of Model Generation Phase is Applied.

Figure 1:
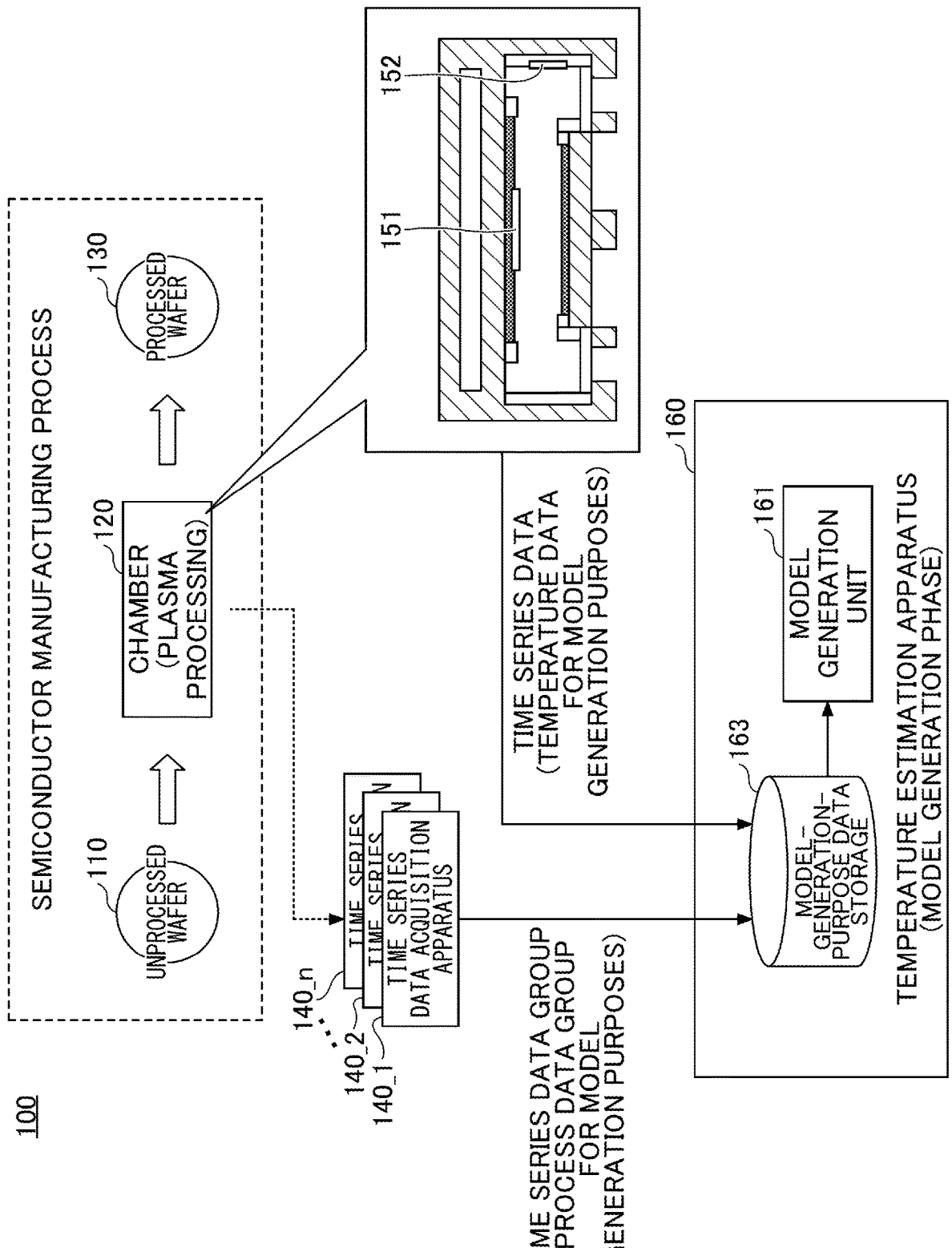
FIG. 1 is a drawing illustrating an example of the system configuration of a plasma processing system to which a temperature estimation apparatus of a model generation phase is applied.

FIG. 1 is a drawing illustrating an example of the system configuration of a plasma processing system to which a temperature estimation apparatus of a model generation phase is applied. As illustrated in FIG. 1, a plasma processing system 100 in the model generation phase includes a semiconductor manufacturing process, time series data acquisition apparatuses 140_1 through 140_n, and a temperature estimation apparatus 160.

In the semiconductor manufacturing process, a target object (i.e., unprocessed wafer 110) is processed in a chamber 120 serving as a processing space for plasma processing to produce a resultant object (i.e., processed wafer 130). In this case, the unprocessed wafer 110 refers to a wafer (i.e., substrate) before being treated with plasma in the chamber 120, and the processed wafer 130 refers to a wafer (i.e., substrate) after being treated with plasma in the chamber 120.

In the model generation phase, one or more temperature sensors are installed inside the chamber 120. Each of the temperature sensors detects time series data (i.e., temperature data for model generation purposes) as observed before the start of plasma processing, or during the performance of plasma processing, with respect to the unprocessed wafer 110 in the chamber 120. In the example illustrated in FIG. 1, a temperature sensor 151 is installed at the position of an upper electrode inside the chamber 120, and a temperature sensor 152 is installed at the position of a sidewall of the chamber 120. The illustrated positions to which the temperature sensors 151 and 152 are mounted are examples only, and mounting positions different from those in FIG. 1 may be used. The number of temperature sensors installed inside the chamber 120 is not limited to two.

The respective time series data (i.e., temperature data for model generation purposes) detected by the temperature sensor 151 and the temperature sensor 152 are stored in a model-generation-purpose data storage 163 of the temperature estimation apparatus 160.

The time series data acquisition apparatuses 140_1 through 140_n detect time series data group (i.e., process data group for model generation purposes) as observed before the start of plasma processing, or during the performance of plasma processing, with respect to the unprocessed wafer 110 in the chamber 120. The time series data acquisition apparatuses 140_1 through 140_n may be constituted by a plurality of sensors (e.g., n sensors), for example, and detect process data with respect to respective, different types of measurement item. The number of measurement items measured by the time series data acquisition apparatuses 140_1 through 140_n may be one, or may be more than one.

The time series data group (i.e., process data group for model generation purposes) detected by the time series data acquisition apparatuses 140_1 through 140_n is stored during the model generation phase in the model-generation-purpose data storage 163 and associated with the time series data (i.e., temperature data for model generation purposes).

A temperature estimation program is installed in the temperature estimation apparatus 160. In the model generation phase, the temperature estimation apparatus 160 functions as a model generation unit 161 upon the program being executed.

The model generation unit 161 uses the data for model generation purposes (i.e., the process data group for model generation purposes and the temperature data for model generation purposes) stored in the model-generation-purpose data storage 163 to perform a model generation process with respect to a time series model, thereby producing a generated time series model.

(2) System Configuration of Plasma Processing System to which Temperature Estimation Apparatus of Estimation Phase is Applied.

Figure 2:
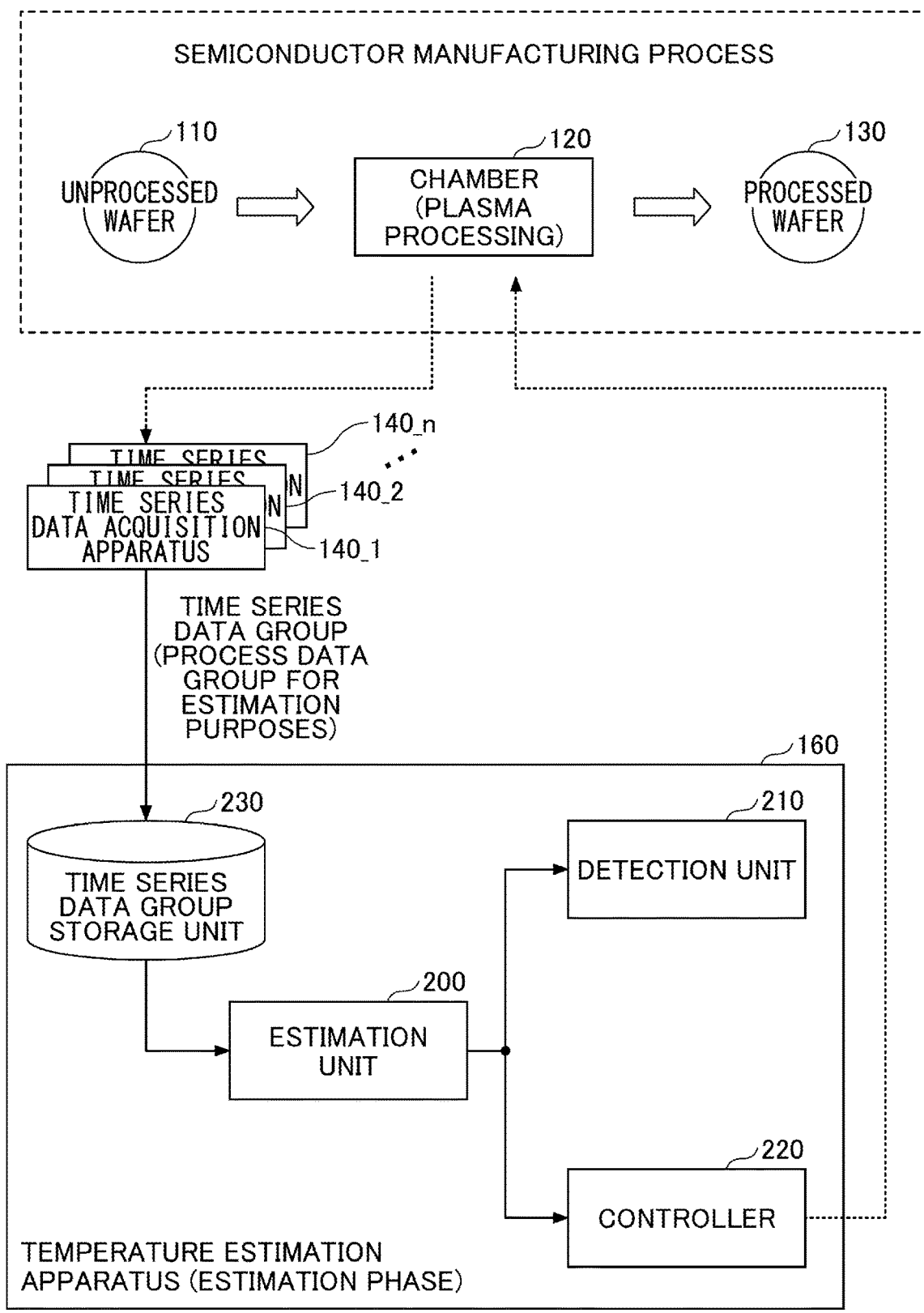
FIG. 2 is a drawing illustrating an example of the system configuration of a plasma processing system to which the temperature estimation apparatus of the estimation phase is applied.

FIG. 2 is a drawing illustrating an example of the system configuration of a plasma processing system to which the temperature estimation apparatus of the estimation phase is applied. The differences from FIG. 1 are that no temperature sensors are installed in the chamber 120 and that the temperature estimation apparatus 160 performs different functions than in the model generation phase.

A temperature estimation program is executed in the estimation phase, so that the temperature estimation apparatus 160 functions as an estimation unit 200, a detection unit 210, and a controller 220.

The estimation unit 200 includes the generated time series model that is provided by the model generation unit 161 during the model generation phase. The estimation unit 200 successively inputs, into the generated time series model, data at each time point of the time series data group (i.e., process data group for estimation purposes) detected by the time series data acquisition apparatuses 140_1 through 140_n and stored in a time series data group storage 230. With this arrangement, the estimation unit 200 obtains estimated temperature data successively output from the generated time series model. The estimation unit 200 supplies the obtained estimated temperature data to either the detection unit 210, the controller 220, or both.

The detection unit 210 constantly monitors estimated current temperature data about the inside of the chamber 120 supplied from the estimation unit 200, and triggers an alarm in real time upon the data falling outside a predetermined temperature range. With this arrangement, the user of the plasma processing system 100 becomes aware in real time that the temperature inside the chamber 120 during plasma processing falls outside the predetermined temperature range.

Among the time series data group (i.e., process data group for estimation purposes) stored in the past in the time series data group storage 230, a time series data group about a particular processed wafer 130 during plasma processing may be used by the estimation unit 200 to supply estimated temperature data. In such a case, the detection unit 210 provides visualization of a time period during which plasma processing outside the predetermined temperature range is performed. With this arrangement, the user of the plasma processing system 100 retrospectively becomes aware of whether temperature during plasma processing with respect to the particular processed wafer 130 fell outside the predetermined temperature range.

The controller 220 controls the semiconductor manufacturing process in real time (e.g., by properly setting the amount of power of an RF power supply, the time length of plasma processing, or the like) such that the currently estimated temperature inside the chamber 120 notified by the estimation unit 200 approaches a target temperature. With this arrangement, the temperature at the start of plasma processing with respect to the unprocessed wafer 110 may be adjusted to the target temperature, for example.

The controller 220 further determines whether the process conditions are appropriate based on the estimated temperature data about the inside of the chamber 120 (e.g., data indicative of estimated temperature during plasma processing with respect to an immediately preceding unprocessed wafer 110) supplied from the estimation unit 200. Moreover, the controller 220 optimizes the process conditions for plasma processing with respect to a next unprocessed wafer 110 (e.g., by properly setting the amount of power of an RF power supply or the time length of plasma processing). With this arrangement, temperature at the time of plasma processing with respect to the next unprocessed wafer 110 may be adjusted to be within the predetermined temperature range, for example.

<Hardware Configuration of Temperature Estimation Apparatus>

Figure 3:
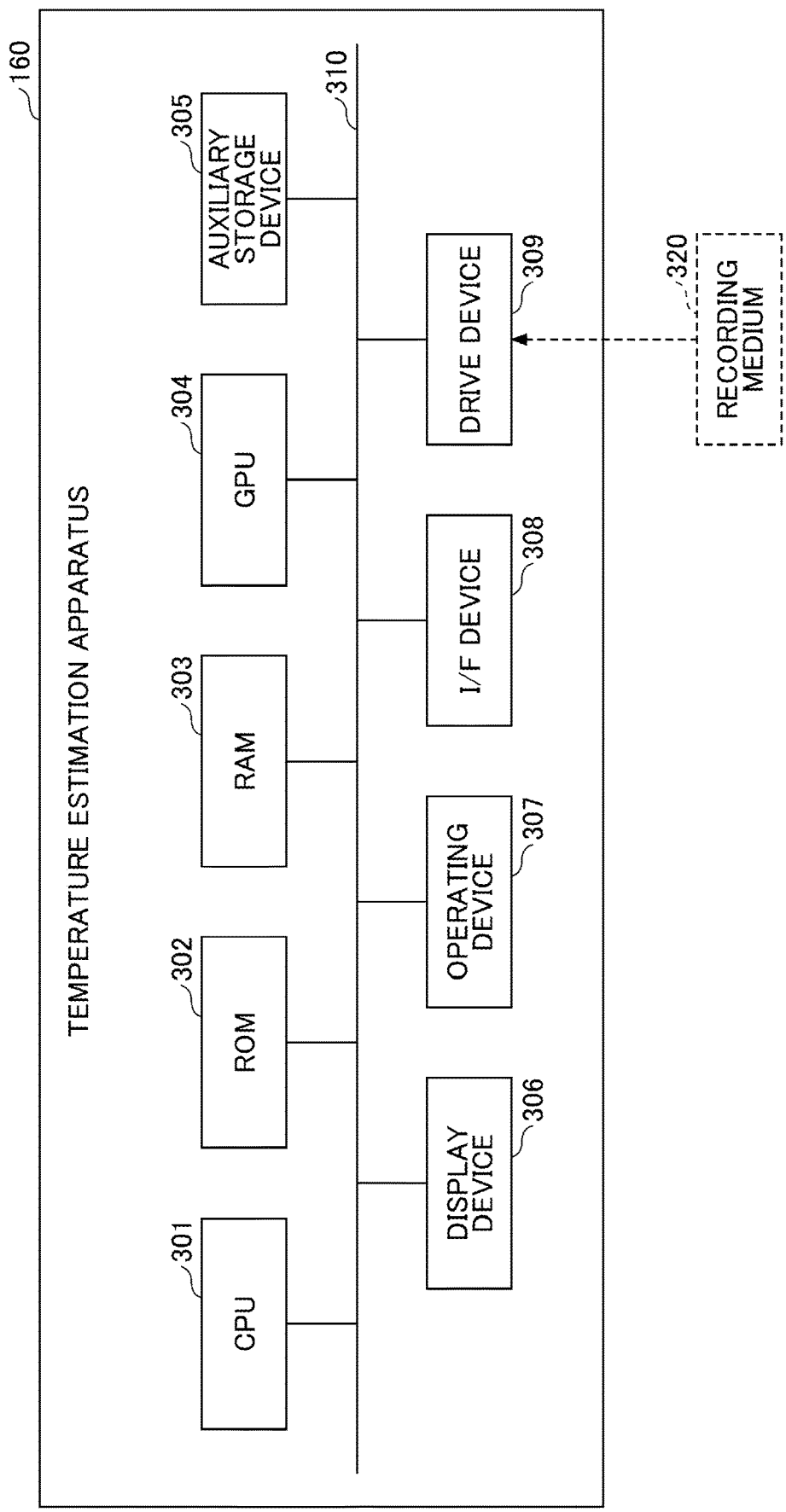
FIG. 3 is a drawing illustrating an example of the hardware configuration of the temperature estimation apparatus.

In the following, the hardware configuration of the temperature estimation apparatus 160 will be described. FIG. 3 is a drawing illustrating an example of the hardware configuration of the temperature estimation apparatus. As illustrated in FIG. 3, the temperature estimation apparatus 160 includes a CPU (central processing unit) 301, a ROM (read only memory) 302, and a RAM (random access memory) 303. The temperature estimation apparatus 160 also includes a GPU (graphic processing unit) 304. The processors (i.e., processing circuits or processing circuitry) such as the CPU 301 and the GPU 304 and the memories such as the ROM 302 and the RAM 303 constitute what is known as a computer.

The temperature estimation apparatus 160 further includes an auxiliary storage device 305, a display device 306, an operating device 307, an I/F (interface) device 308, and a drive device 309. The individual hardware parts of the temperature estimation apparatus 160 are connected to one another through a bus 310.

The CPU 301 is an arithmetic device which executes various types of program (e.g., temperature estimation programs) installed in the auxiliary storage device 305.

The ROM 302 is a nonvolatile memory, and serves as a main memory device. The ROM 302 stores various types of programs, data, and the like necessary for the CPU 301 to execute the various types of programs installed in the auxiliary storage device 305. Specifically, the ROM 302 stores boot programs and the like such as BIOS (basic input/output system) and EFI (extensible firmware interface).

The RAM 303 is a volatile memory such as a DRAM (dynamic random access memory) and an SRAM (static random access memory), and serves as a main memory device. The RAM 303 provides a work area to which the various types of programs installed in the auxiliary storage device 305 are loaded when executed by the CPU 301.

The GPU 304 is an arithmetic device for image processing. When a temperature estimation program is executed by the CPU 301 in the present embodiment, the GPU 304 performs high-speed arithmetic operations based on parallel processing with respect to the time series data group. The GPU 304 includes an internal memory (i.e., GPU memory), which temporarily retains information necessary to perform parallel processing with respect to the time series data group.

The auxiliary storage device 305 stores various types of program, and stores various types of data and the like used when the various types of program are executed by the CPU 301. The model-generation-purpose data storage 163 and the time series data group storage 230 are implemented as the auxiliary storage device 305, for example.

The display device 306 is a display apparatus that displays an alarm for the user of the plasma processing system 100. The operating device 307 is an input device used by the user of the plasma processing system 100 or the administrator of the temperature estimation apparatus 160 to input various types of instruction into the temperature estimation apparatus 160. The I/F device 308 is a connection device for connecting to, and communicating with, a network (not shown).

The drive device 309 is a device to which a recording medium 320 is set. Here, the recording medium 320 includes a medium for optically, electrically, or magnetically recording information, such as a CD-ROM, a flexible disk, a magneto-optical disk, or the like. The recording medium 320 may also include a semiconductor memory or the like that electrically records information, such as a ROM, a flash memory, or the like.

The various types of programs to be installed in the auxiliary storage device 305 are installed by the drive device 309 reading the various types of programs recorded in the recording medium 320 upon the recording medium 320 being supplied and set in the drive device 309, for example.

Alternatively, the various types of program to be installed in the auxiliary storage device 305 may be installed upon being downloaded via a network (not shown).

<Specific Example of Model-Generation-Purpose Data>

Figure 4A:
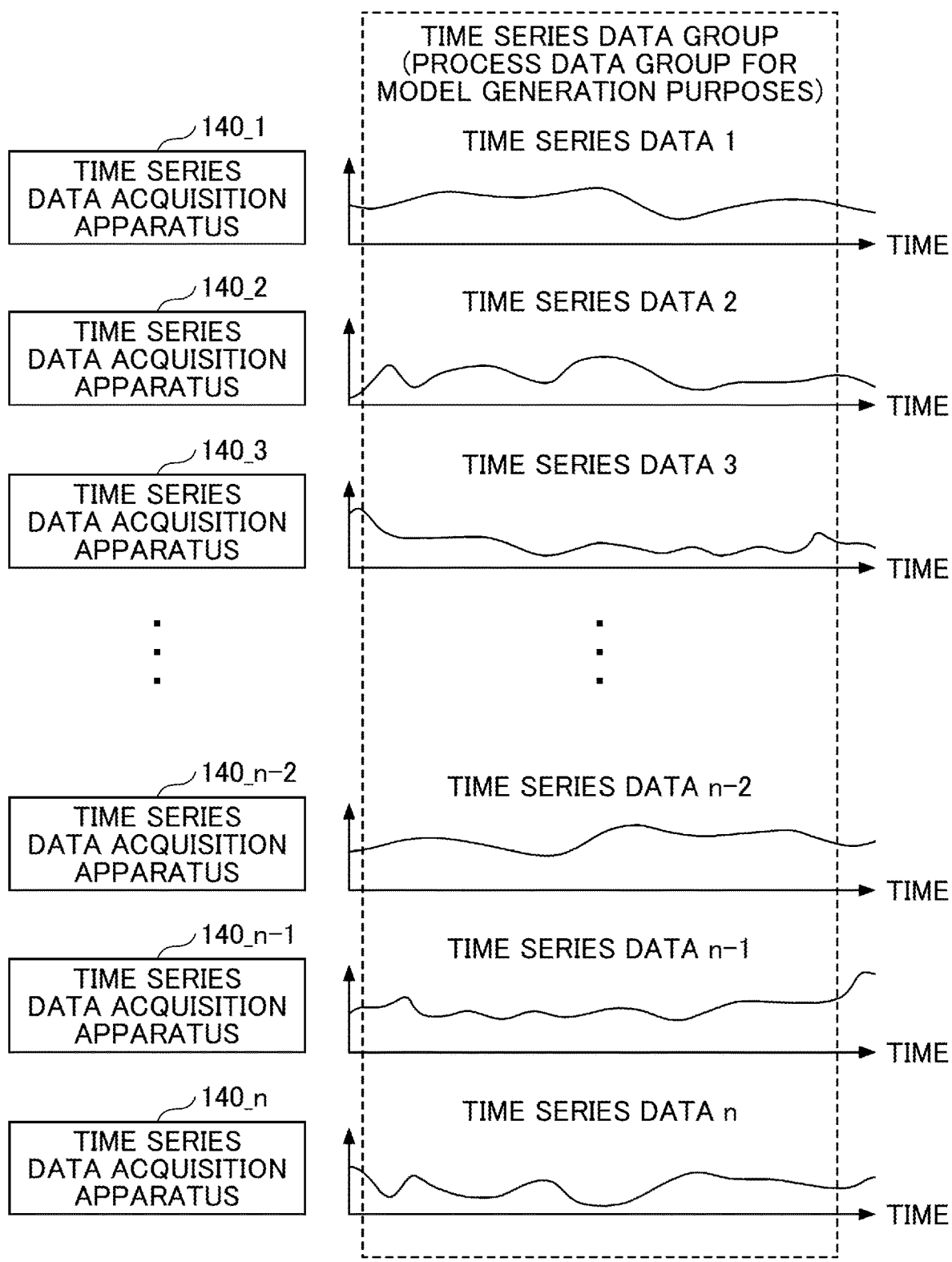
FIGS. 4A and 4B are drawings illustrating examples of data for model generation purposes (i.e., process data group for model generation purposes and temperature data for model generation purposes)
Figure 4B:
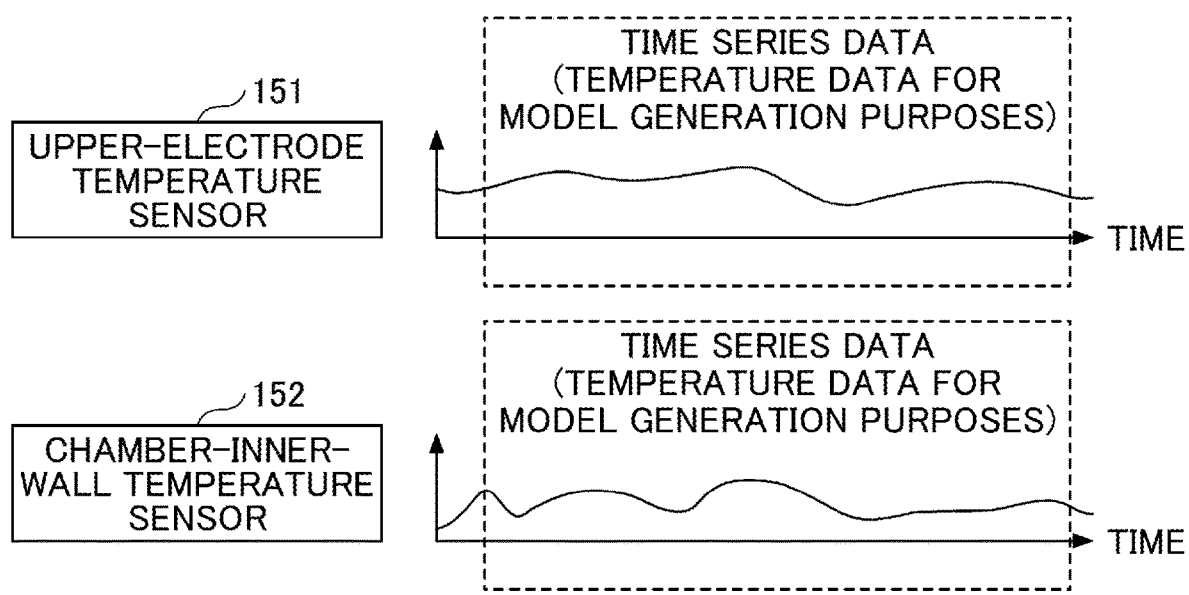

In the following, a description will be given with respect to specific examples of data for model generation purposes (i.e., process data group for model generation purposes and temperature data for model generation purposes) stored in the model-generation-purpose data storage 163. FIGS. 4A and 4B are drawings illustrating examples of data for model generation purposes (i.e., process data group for model generation purposes and temperature data for model generation purposes). The examples illustrated in FIGS. 4A and 4B are configured, for the sake of simplicity of explanation, such that each of the time series data acquisition apparatuses 140_1 through 140_$n$ measures one-dimensional data. Notwithstanding this, one time series data acquisition apparatus may measure two-dimensional data (i.e., a data set comprised of two or more kinds of one-dimensional data).

FIG. 4A schematically illustrates time series data group (i.e., process data group for model generation purposes) constituted by respective time series data measured by the time series data acquisition apparatuses 140_1 through 140_$n$ during the same time period.

In FIG. 4A, time series data 1 schematically represents gas flow rate data (e.g., data detected by a sensor that measures the flow rate of gas supplied into the chamber 120), for example. The gas noted above includes all types of gas (i.e., process gases and inactive gases) supplied into the chamber 120. The sensor for measuring the flow rate of gas includes sensors disposed in the gas lines for respective types of gas (in the illustrated example, only the time series data 1 is illustrated for the sake of convenience of illustration).

In FIG. 4A, time series data 2 schematically represents pressure data about the inside of the chamber 120 (e.g., data detected by a sensor that measures pressure inside the chamber 120), for example. Further, time series data 3 schematically represents RF power supply data (e.g., data detected by a sensor that measures the amount of power of an RF power supply for plasma processing), for example.

In FIG. 4A, time series data n−1 schematically represents impedance data (e.g., data detected by a sensor that measures a chamber impedance (indicative of matching position, current, voltage, etc.)), for example. In FIG. 4A, time series data n schematically represents heater power data (e.g., data detected by a sensor that measures the amount of power of a heater heating the inside of the chamber 120), for example.

FIG. 4B schematically illustrates time series data (i.e., temperature data for model generation purposes) measured for the corresponding time range by the temperature sensor 151 installed at the position of the upper electrode. FIG. 4B further schematically illustrates time series data (i.e., temperature data for model generation purposes) measured for the corresponding time range by the temperature sensor 152 installed at the position of the inner wall of the chamber 120.

<Relationship between Process Data Group and Temperature Data>

In the following, a description will be given of the relationship between the time series data group (i.e., process data group for model generation purposes) detected by the time series data acquisition apparatuses 140_1 through 140_n and the time series data (i.e., temperature data for model generation purposes) detected by the temperature sensors 151 and 152.

Figure 5A:
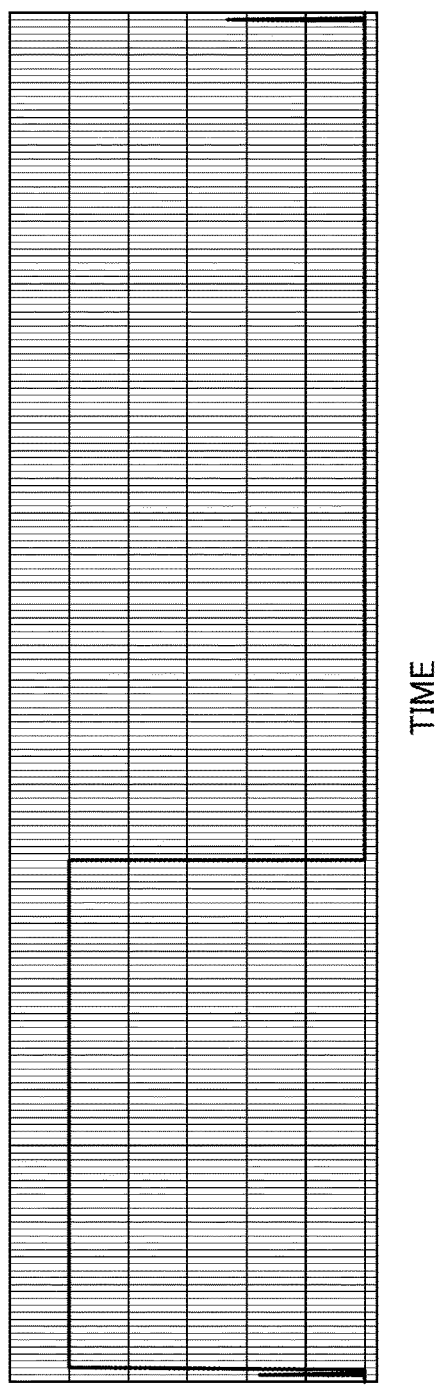
FIGS. 5A and 5B are drawings illustrating examples of actual measurements of process data and temperature data.
Figure 5B:
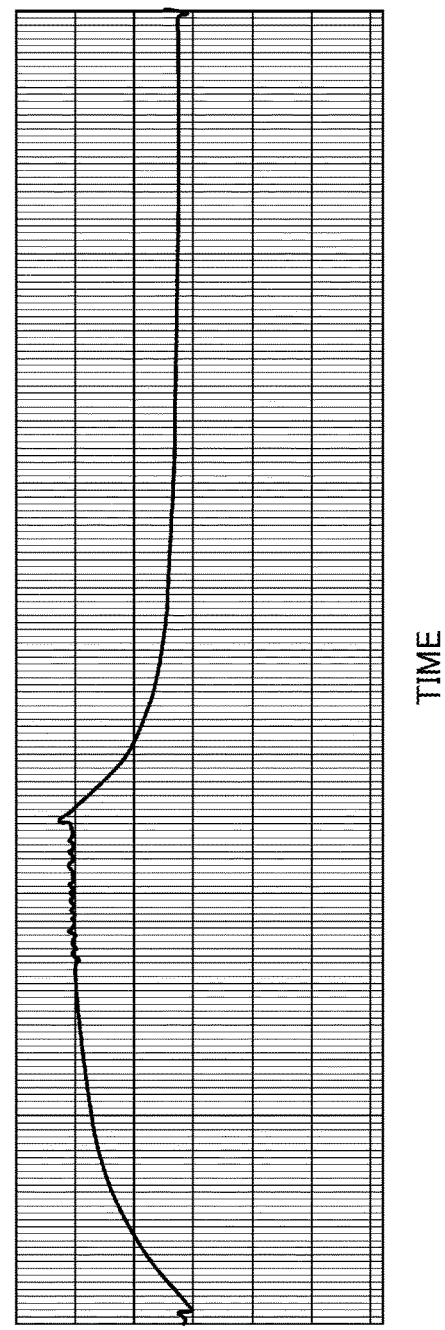

FIGS. 5A and 5B are drawings illustrating examples of actual measurements of process data and temperature data. FIG. 5A illustrates actual measurements of RF power supply data. The horizontal axis represents time, and the vertical axis represents the power level. FIG. 5B illustrates actual measurements of temperature data detected by the temperature sensor 151 installed at the position of the upper electrode. The horizontal axis represents time, and the vertical axis represents temperature.

As illustrated in FIGS. 5A and 5B, the temperature data about the inside of the chamber 120 changes with a predetermined time delay relative to changes in process data. This is because it takes a certain amount of time for thermally conductive materials constituting parts inside the chamber 120 to conduct heat. It also takes a certain amount of time for the temperature of the parts to stabilize after the parts inside the chamber 120 conduct heat.

In consideration of such temperature characteristics inside the chamber 120, the temperature estimation apparatus 160 of the present embodiment performs a model generation process for a time series model that can represent a time delay, and then estimates temperature data by using the generated time series model.

<Outline of Model Generation Unit>

In the following, an outline of the model generation unit 161 of the temperature estimation apparatus 160 will be described. The model generation unit 161 includes a time series model such as an ARX model, for example. The model generation unit 161 uses the data for model generation purposes (i.e., the process data group for model generation purposes and the temperature data for model generation purposes) stored in the model-generation-purpose data storage 163 to perform a batch-type model generation process with respect to the noted time series model.

Specifically, the model generation unit 161 reads the process data group for model generation purposes from the model-generation-purpose data storage 163, and successively supply them to the time series model. Further, the model generation unit 161 compares the resultant outputs successively produced by the time series model with the corresponding temperature data for model generation purposes (e.g., the temperature data detected by the temperature sensor 151 installed at the position of the upper electrode) to calculate errors.

Moreover, the model generation unit 161 determines model parameters of the time series model such that the sum of squared errors as calculated above becomes minimum.

The generated time series model for which the model parameters have been determined may be represented as follows.

$$y(k) = -a_1 y(k-1) - \ldots - a_{m_a} y(k-m_a) + b_1 u(k-1) + \ldots + b_{m_b} u(k-m_b) + e \quad \text{Formula 1}$$

In the above-noted formula, k represents current time, and y(k) represents current temperature data. Further, y(k−1) to y(k−$m_a$) represent past temperature data over a time period $m_a$ preceding the currently output temperature data. Moreover, u(k−1) to u(k−$m_b$) represent a past process data group over a time period $m_b$ preceding the current process data group. It may be noted that u(•) may be a n-by-1 matrix, for example, representing a set of n process data values at a given time point, and that its coefficient b may be a 1-by-n matrix, for example. The determined model parameters are represented by $a_1$ to $a_{m_a}$ and $b_1$ to $b_{m_b}$.

As is understood from the above formula, the time series model is configured such that the process data group in the predetermined past time period mb and the temperature data in the predetermined past time period ma are added together to produce a weighted sum by using the determined model parameters as weights, thereby calculating the current temperature data.

With this arrangement, the temperature estimation apparatus 160 can estimate temperature data responsive to changes in process data by using the generated time series model even when conditions inside the chamber 120 have been changed.

The above described example has been directed to the case in which the model parameters of the time series model are determined based on temperature data detected by the temperature sensor 151 that is installed at the position of an upper electrode. Similar processing may be performed with respect to the temperature data detected by the temperature sensor 152 installed at the position of the sidewall of the chamber 120 to determine the model parameters of the time series model.

The case of using the temperature data detected by the temperature sensor 151 and the case of using the temperature data detected by the temperature sensor 152 produce respective, different model parameters. The model generation unit 161 thus manages these as respective, different, generated time series models.

In the above described example, no description has been given with respect to the method of determining the predetermined time periods $m_a$ and $m_b$ (i.e., the method of selecting the range of subscript values). Nonetheless, the range of subscript values may be optimized through adjustment as appropriate. In the above described example, further, no description has been given with respect to the method of selecting a process data group input into the time series model among all the process data group for model generation purposes. The process data group input into the time series model may be optimized through adjustment as appropriate.

<Model Generation Process Flow>

Figure 6:
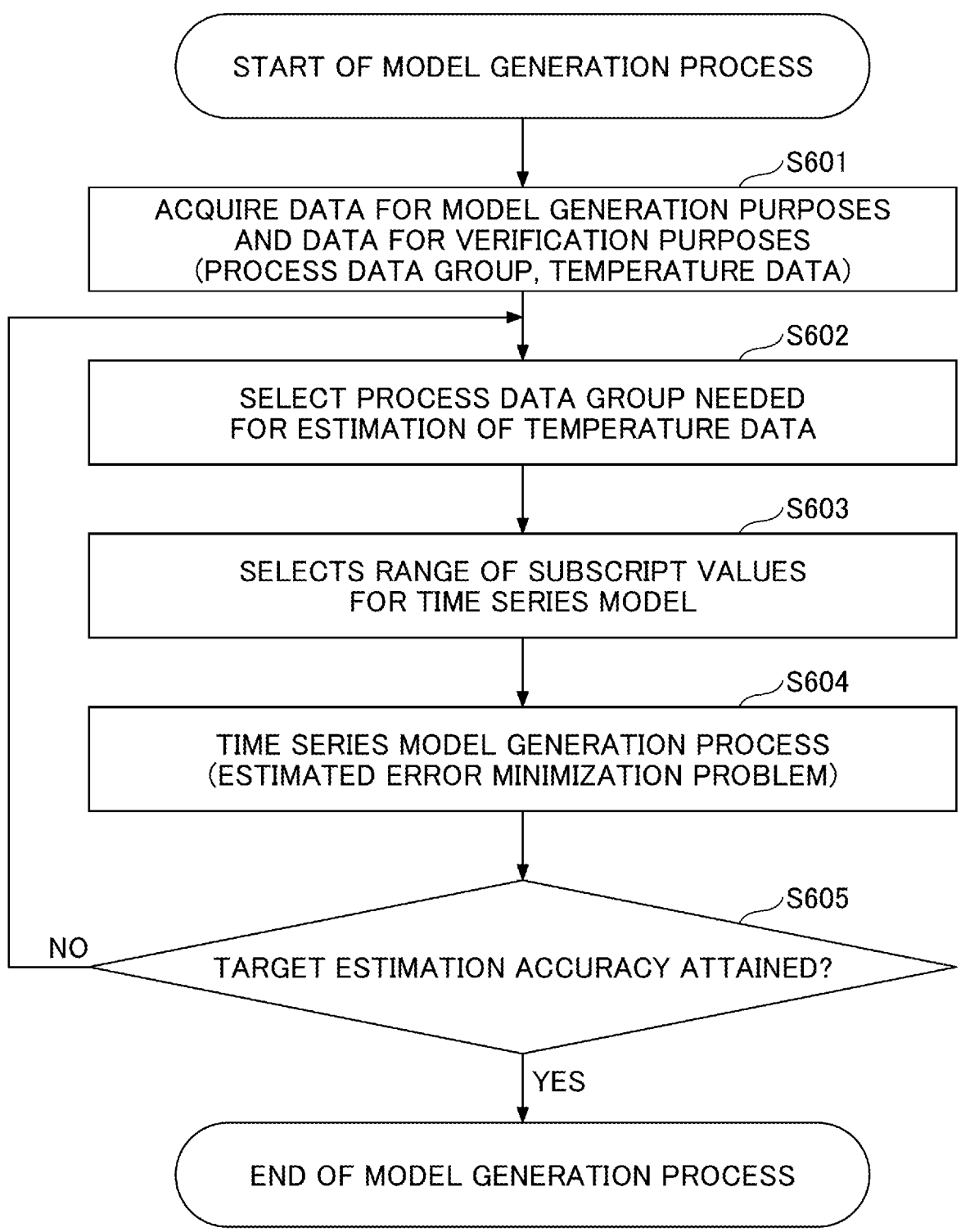
FIG. 6 is a flowchart illustrating the procedure of the model generation process.

In the following, a description will be given with respect to the flow of the model generation process for the plasma processing system during the model generation phase. FIG. 6 is a flowchart illustrating the procedure of the model generation process.

In step S601, the temperature estimation apparatus 160 acquires data for model generation purposes and data for verification purposes. Specifically, the temperature estimation apparatus 160 receives a process data group and temperature data from the time series data acquisition apparatuses 140_1 through 140_n and the temperature sensor 151 (or 152), respectively, as the data for model generation purposes. Similarly, the temperature estimation apparatus 160 receives a process data group and temperature data from the time series data acquisition apparatuses 140_1 through 140_n and the temperature sensor 151 (or 152), respectively, as the data for verification purposes.

In step S602, the temperature estimation apparatus 160 selects, from the process data group for model generation purposes, a process data group (i.e., subgroup) needed for estimation of temperature data.

In step S603, the temperature estimation apparatus 160 selects the range of subscript values for the time series model of the model generation unit 161.

In step S604, the temperature estimation apparatus 160 performs a model generation process with respect to the time series model to determine the model parameters of the time series model, such that the sum of squared errors becomes minimum when the selected process data group is input.

In step S605, the temperature estimation apparatus 160 uses the data for verification purposes to verify the time series model (i.e., generated time series model) for which the model parameters have been determined.

Specifically, a check is made as to whether a target estimation accuracy has been attained. Upon determining, as a result of the verification, that the target estimation accuracy has not been attained (NO in step S605), the procedure returns to step S602, in which new process data contributing to an improvement in estimation accuracy may be added to the previously selected process data group, or a different combination of process data (a different process data subgroup) from the previous combination is selected before repeating the subsequent processes.

Upon determining in step S605 that the target estimation accuracy has been attained (YES in step S605), the model generation process comes to an end.

<Specific Example of Functional Configuration and Processing of Estimation Unit>

Figure 7:
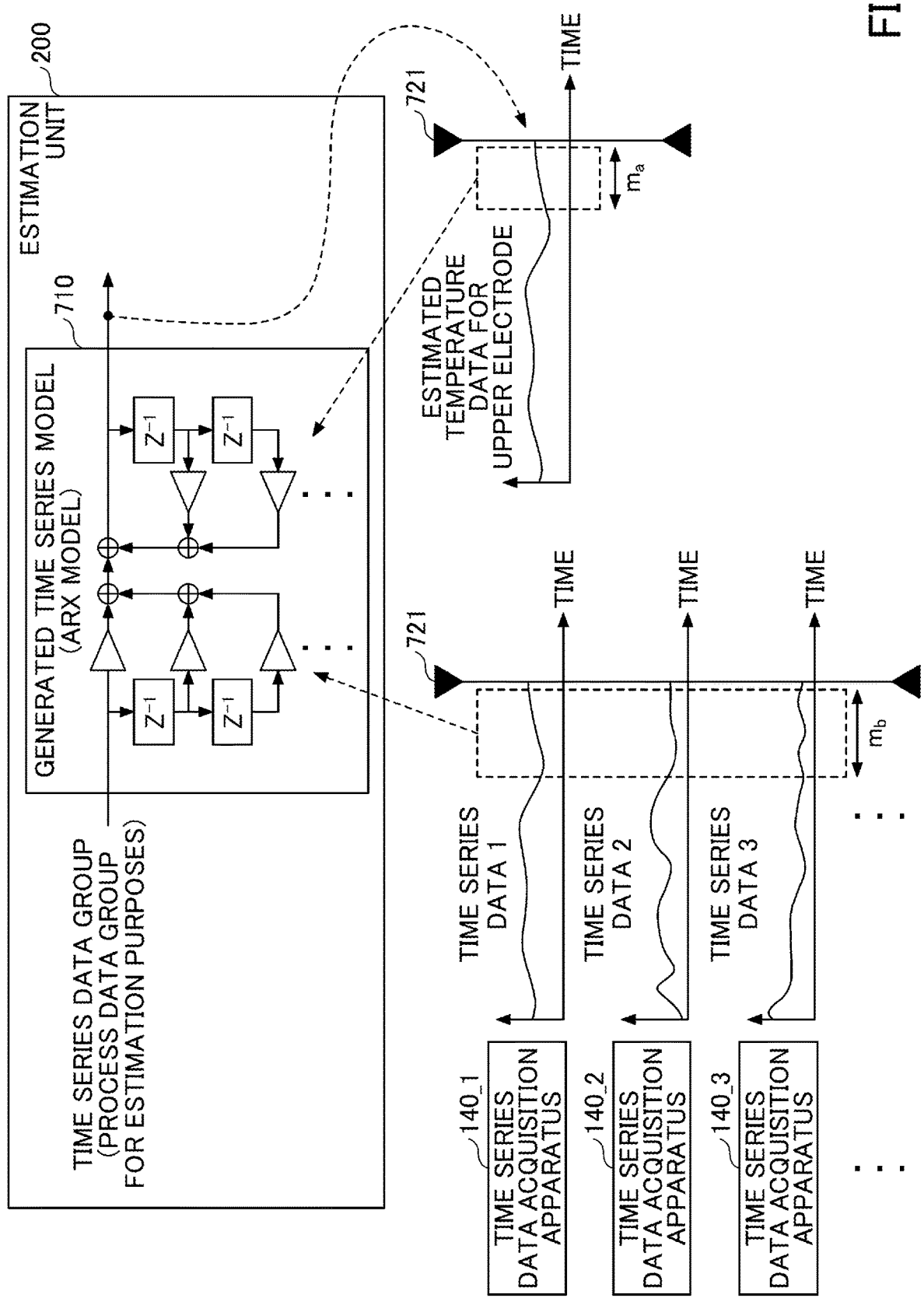
FIG. 7 is a drawing illustrating a specific example of the functional configuration and processing of the estimation unit.

In the following, the functional configuration of the estimation unit 200 and the processing of the estimation unit 200 will be described by using a specific example. FIG. 7 is a drawing illustrating a specific example of the functional configuration and processing of the estimation unit.

As illustrated in FIG. 7, the estimation unit 200 includes a generated time series model 710 that is provided by the model generation unit 161.

The estimation unit 200 successively inputs, into the generated time series model 710, the time series data group (i.e., process data group for estimation purposes) acquired by the time series data acquisition apparatuses 140_1 through 140_n. The time series data group (i.e., process data group for estimation purposes) input at this time is the selected process data group (i.e., time series process data group relating to the conditions of the chamber 120) as used when the predetermined estimation accuracy has been attained during the model generation process.

It may be noted that in the estimation unit 200, an initial temperature data value is input into, or set in, the generated time series model 710 before the selected process data group is input. In this regard, the temperature initialization sequence involves running the chamber 120 in an idling state for a predetermined period or longer to achieve sufficiently stabilized temperature, and collecting, in conjunction therewith, a process data group and temperature measurements for longer than the periods for which $a_1$ to $a_{ma}$ and $b_1$ to $b_{mb}$ are defined. Such a process data group and temperature measurements are used to set an initial temperature in the generated time series model 710.

In the example illustrated in FIG. 7, the current process data group is the data group of the time series data at the time indicated by numeral 721, and this process data group is being input into the time series model.

As illustrated in FIG. 7, the generated time series model 710 uses a past process data group over the time period $m_b$ preceding the current process data group for calculation of estimated temperature data. Further, the generated time series model 710 uses past estimated temperature data over the time period $m_a$ preceding the estimated current temperature data (i.e., estimated temperature data at the time indicated by numeral 721) for calculation of estimated current temperature data.

Namely, in the generated time series model 710,
the past process data group over the time period $m_b$ preceding the current process data group as indicated by 721 (i.e., the past process data group over the predetermined time period preceding the current process data group), and
the past estimated temperature data over the time period $m_a$ preceding the estimated current temperature data as indicated by 721 (i.e., the estimated temperature data estimated in the past over the predetermined time period preceding the estimated temperature data that is being estimated) are used as a basis to calculate the estimated temperature data that is being estimated for the current time point (as indicated by 721). Moreover, the generated time series model 710 supplies, to the detection unit 210 and the controller 220, the estimated temperature data that is estimated for the current time point (as indicated by 721), successively each time it is estimated.

In this manner, the estimation unit 200 successively inputs a new process data group of the time series relating to conditions inside the chamber 120 into the generated time series model 710, thereby successively outputting the estimated temperature data.

FIG. 7 has been described with respect to the case in which temperature data regarding the position of an upper electrode is estimated. Alternatively, using the generated time series model 710 for estimating temperature data regarding the position of a sidewall of the chamber 120 allows such temperature data to be successively estimated.

<Specific Example of Functional Configuration and Processing of Detection Unit>

Figure 8:
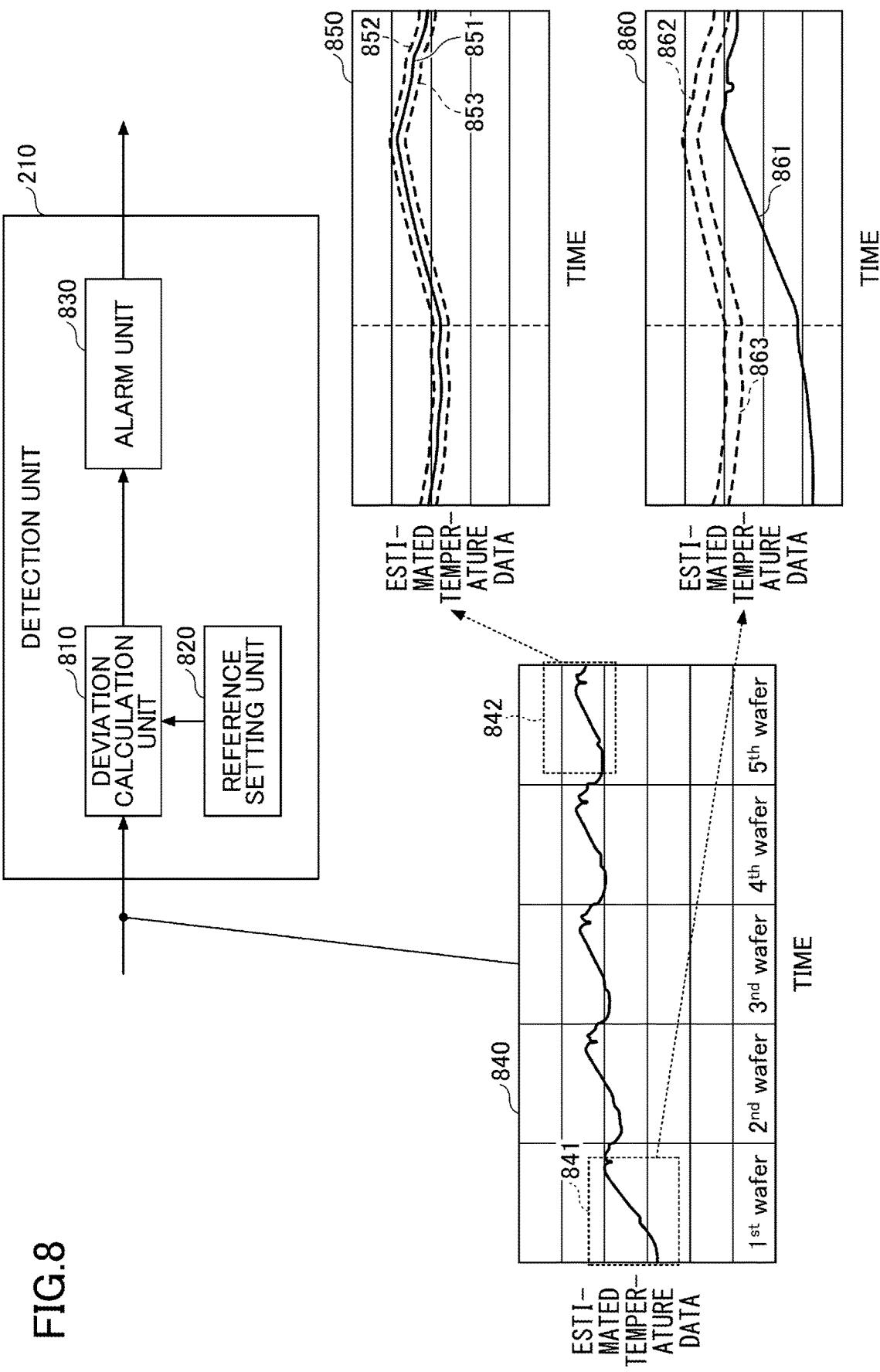
FIG. 8 is a drawing illustrating a specific example of the functional configuration and processing of the detection unit.

In the following, the functional configuration of the detection unit 210 and the processing of the detection unit 210 will be described by using a specific example. FIG. 8 is a drawing illustrating a specific example of the functional configuration and processing of the detection unit.

As is illustrated in FIG. 8, the detection unit 210 includes a deviation calculation unit 810, a reference setting unit 820, and an alarm unit 830.

The deviation calculation unit 810 receives real-time estimated temperature data supplied from the estimation unit 200 at predetermined intervals, for example. Each time the real-time estimated temperature data is received, the deviation calculation unit 810 determines whether the estimated temperature data falls outside the temperature range that is set in advance by the reference setting unit 820.

Upon determining that the estimated temperature data falls outside the temperature range set in advance, the deviation calculation unit 810 calculates the amount of deviation, and notifies the alarm unit 830. In FIG. 8, a graph 840 illustrates the real-time estimated temperature data supplied from the estimation unit 200 to the deviation calculation unit 810. Specifically, the graph 840 illustrates estimated temperature data obtained in the case in which plasma processing is continuously performed with respect to a plurality of unprocessed wafers. The horizontal axis represents processing time with respect to those unprocessed wafers, and the vertical axis represents estimated temperature data.

In FIG. 8, a graph 860 provides an enlarged view of a time period 841 in the graph 840. In the graph 860, a dashed line 862 represents the upper limit values of the temperature range set in advance by the reference setting unit 820, and a dashed line 863 represents the lower limit of the temperature range set in advance by the reference setting unit 820.

The graph 860 illustrates that estimated temperature data 861 falls outside the predetermined temperature range (i.e., falls below the lower limit values indicated by the dashed line 863 in the example illustrated in FIG. 8). The deviation calculation unit 810 thus determines that the estimated temperature data 861 falls outside the temperature range set in advance, followed by calculating the amount of deviation. In this case, the alarm unit 830 notifies the user of the plasma processing system 100 of an alarm indicating the occurrence of deviation from the predetermined temperature range.

In FIG. 8, a graph 850 provides an enlarged view of a time period 842 in the graph 840. In the graph 850, a dashed line 852 represents the upper limit values of the temperature range set in advance by the reference setting unit 820, and a dashed line 853 represents the lower limit of the temperature range set in advance by the reference setting unit 820.

The graph 850 illustrates that estimated temperature data 851 falls within the predetermined temperature range. The deviation calculation unit 810 thus determines that the estimated temperature data 851 does not fall outside the temperature range set in advance. In this case, the alarm unit 830 reports no alarm to the user of the plasma processing system 100.

The above description has been given with respect to the case in which the detection unit 210 performs a real-time detection process with respect to the estimated temperature data supplied from the estimation unit 200. Alternatively, substantially the same detection process may be performed with respect to estimated temperature data supplied from the estimation unit 200 based on a past time series data group stored in the model-generation-purpose data storage 163.

In such a case, however, the alarm unit 830 notifies the user of the plasma processing system 100 by providing visualization of a time period during which plasma processing outside the predetermined temperature range was performed.

<Specific Example of Functional Configuration and Processing of Controller>

Figure 9:
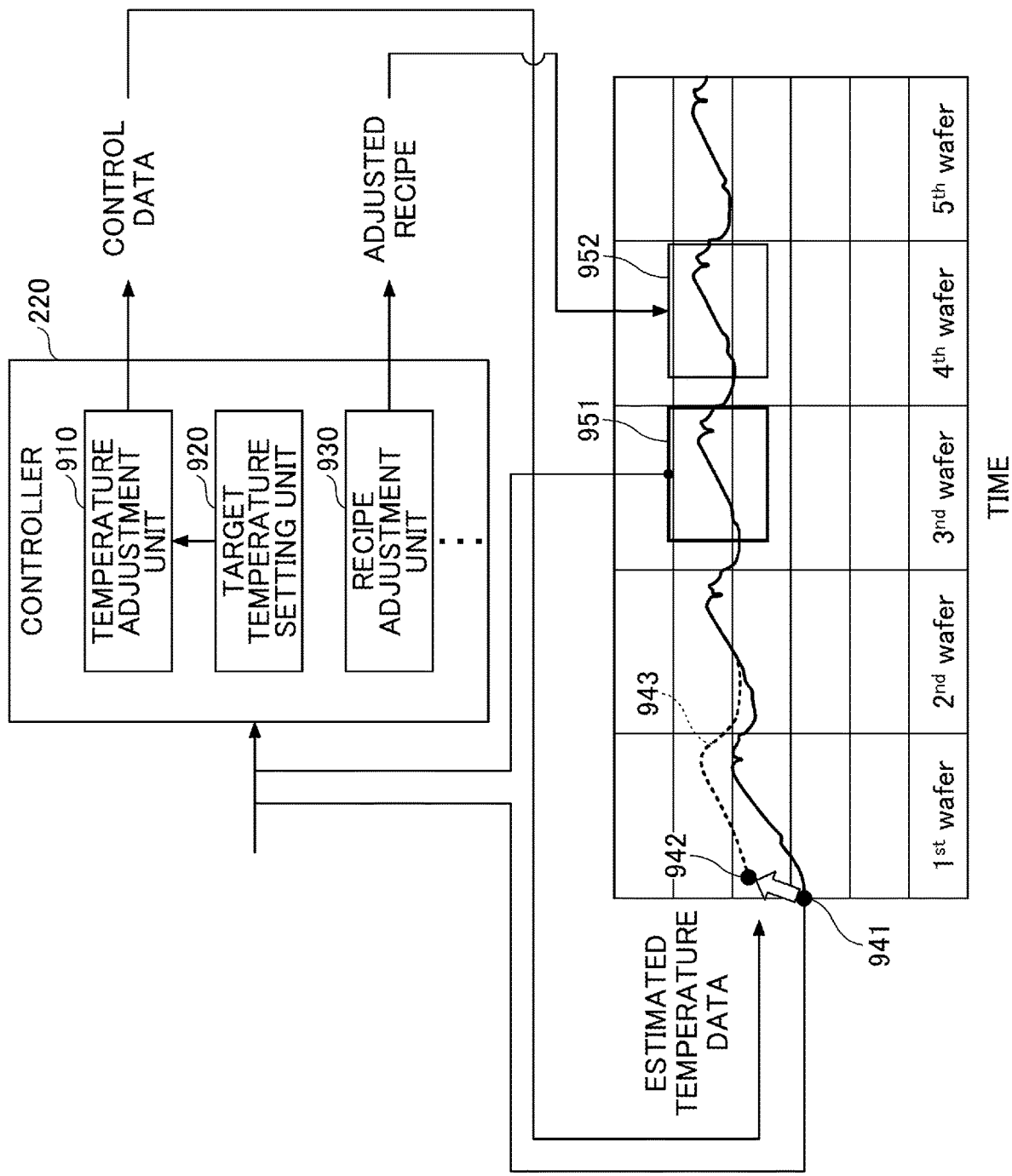
FIG. 9 is a drawing illustrating a specific example of the functional configuration and processing of the controller.

In the following, the functional configuration of the controller 220 and the processing of the controller 220 will be described by using a specific example. FIG. 9 is a drawing illustrating a specific example of the functional configuration and processing of the controller.

As illustrated in FIG. 9, the controller 220 includes a temperature adjustment unit 910, a target temperature setting unit 920, and a recipe adjustment unit 930.

The temperature adjustment unit 910 generates control data such that the currently estimated temperature inside the chamber 120 approaches the target temperature based on the real-time estimated temperature data supplied from the estimation unit 200 during a seasoning process, for example. The target temperature is set by the target temperature setting unit 920, for example.

The temperature adjustment unit 910 sends the generated control data to the semiconductor manufacturing process to adjust the temperature inside the chamber 120.

In related-art technology, even when the temperature has dropped to a temperature indicated by numeral 941 at the start of plasma processing, for example, plasma processing is initiated without taking any countermeasure because it is not possible to obtain accurately estimated temperature data at that point in time. In contrast, the estimation unit 200 provides estimated current temperature data in real time, which allows the temperature adjustment unit 910 to adjust the temperature inside the chamber 120 during a seasoning process, for example, such as to make it reach the target temperature indicated by numeral 942. As a result, changes in temperature during plasma processing with respect to a first unprocessed wafer become substantially the same as changes in temperature with respect to second and subsequent unprocessed wafers, which allows the first processed wafer after the plasma processing to have a controlled quality.

The recipe adjustment unit 930 determines whether the process conditions are appropriate based on the estimated temperature data output during plasma processing (e.g., estimated temperature data output during plasma processing performed on an immediately preceding unprocessed wafer 110), for example. Based on the determination as to whether the process conditions are appropriate, further, the recipe adjustment unit 930 adjusts recipes to optimize the process conditions for plasma processing that is to be performed on a next unprocessed wafer 110. Moreover, the recipe adjustment unit 930 transmits the adjusted recipes to the semiconductor manufacturing process so that plasma processing is performed by use of the adjusted recipes.

In related-art technology, plasma processing is continuously performed to use the same recipes even when temperature inside the chamber 120 has changed. In contrast, the recipe adjustment unit 930 ensures that recipes responsive to temperature changes are used (see numerals 951 and 952). As a result, temperature at the time of plasma processing with respect to the next unprocessed wafer 110 is properly adjusted to be within the predetermined temperature range.

The example illustrated in FIG. 9 has been described by taking, as examples, the function to adjust temperature inside the chamber 120 during a seasoning process and the function to adjust recipes during plasma processing. It may be noted, however, that the adjustment function of the controller 220 performed based on estimated temperature data is not limited to these examples.

[Flow of Estimation Process]

Figure 10:
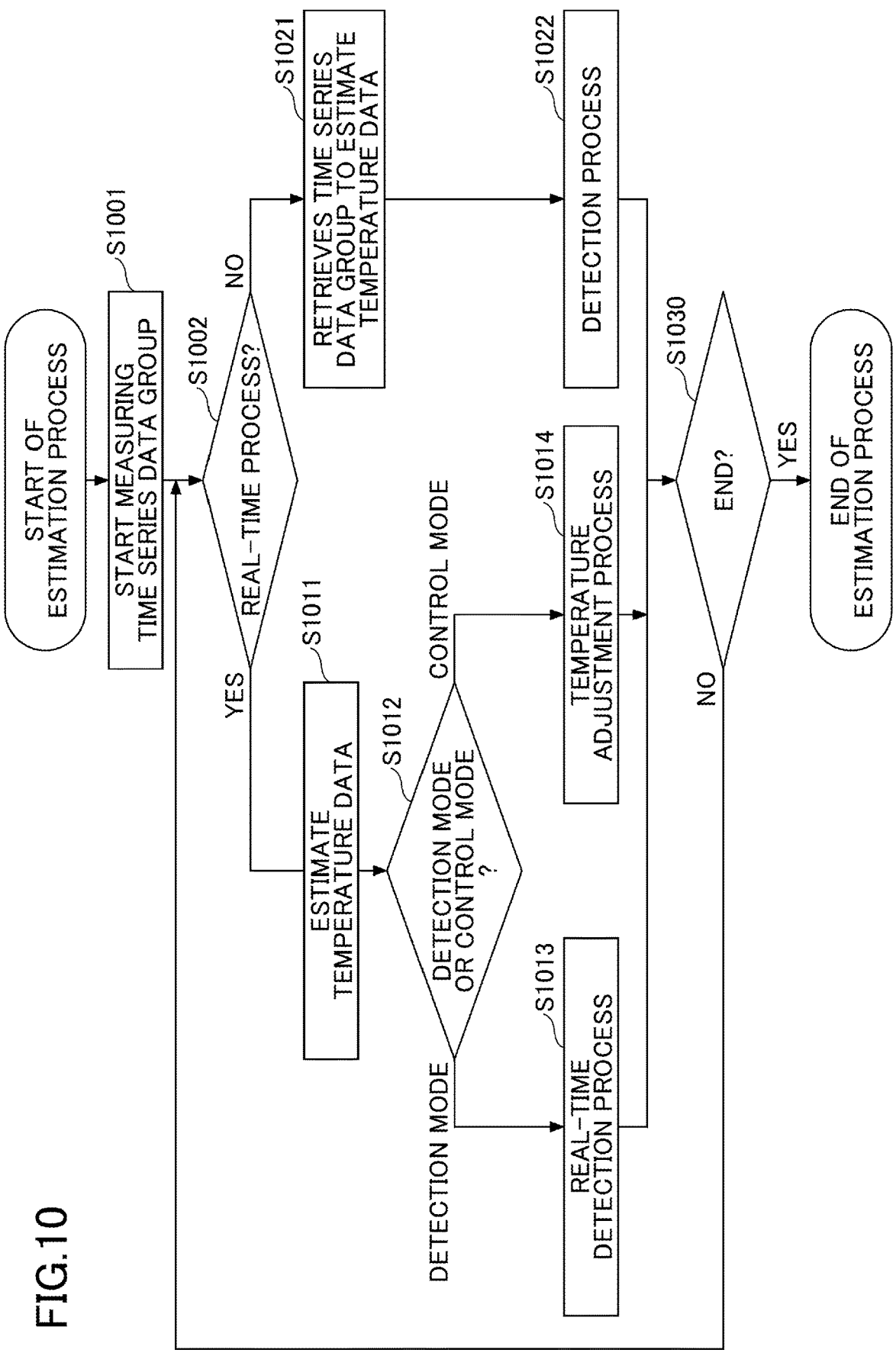
FIG. 10 is a flowchart illustrating an estimation process.

In the following, a description will be given with respect to the flow of an estimation process performed during the estimation phase of the plasma processing system. FIG. 10 is a flowchart illustrating an estimation process.

In step S1001, the time series data acquisition apparatuses 140_1 through 140_*n* start measuring a time series data group (i.e., process data group for estimation purposes), followed by storing the measured time series data group in the time series data group storage 230.

In step S1002, the temperature estimation apparatus 160 determines whether or not to perform a real-time process by use of the time series data group. The term "real-time process" refers to the process that causes the time series data group (i.e., process data group for estimation purposes) obtained before the start of plasma processing or during the execution of plasma processing to be input into the generated time series model, so as to produce estimated temperature data in real time.

Upon determining in step S1002 that a real-time process is to be performed (YES in step S1002), the procedure proceeds to step S1011.

In step S1011, the temperature estimation apparatus 160 inputs, into the generated time series model, a process data group (i.e., process data group of the time series relating to the conditions of the chamber) selected from the measured time series data group (i.e., process data group for estimation purposes). It may be noted that the temperature estimation apparatus 160 inputs initial temperature data values into the generated time series model at the start of an estimation process. This enables the temperature estimation apparatus 160 to output real-time estimated temperature data.

In step S1012, the temperature estimation apparatus 160 determines whether a detection mode is performed or a control mode is performed. Upon determining in step S1012 that a detection mode is to be performed, the procedure proceeds to step S1013.

In step S1013, the temperature estimation apparatus 160 performs a real-time detection process, and triggers an alarm when the estimated current temperature data falls outside a temperature range set in advance.

Alternatively, upon determining in step S1012 that a control mode is to be performed, the procedure proceeds to step S1014.

In step S1014, the temperature estimation apparatus 160 performs a temperature adjustment process to adjust temperature inside the chamber such that the temperature indicated by the estimated current temperature data reaches a target temperature. Alternatively, the temperature estimation apparatus 160 determines whether the process conditions used in plasma processing on an immediately preceding unprocessed wafer are appropriate. The temperature estimation apparatus 160 then adjusts recipes to optimize the process conditions for plasma processing that is to be performed on a next unprocessed wafer.

Upon determining in step S1002 that a real-time process is not to be performed (NO in step S1002), the procedure proceeds to step S1021.

In step S1021, the temperature estimation apparatus 160 retrieves, from the time series data group storage 230 storing the time series data group (i.e., process data group for estimation purposes), a selected process data group (i.e., process data group of the time series regarding the conditions of the chamber) that is the time series data group of a particular processed wafer 130 obtained during plasma processing, for example. The temperature estimation apparatus 160 inputs the retrieved process data group into the generated time series model, thereby outputting estimated temperature data.

In step S1022, the temperature estimation apparatus 160 performs a detection process, and provides visualization of a time period during which plasma processing outside the predetermined temperature range was performed among the estimated temperature data, thereby notifying the user of the plasma processing system 100.

In step S1030, the temperature estimation apparatus 160 determines whether to terminate the estimation process. Upon determining in step S1030 that the estimation process is to be continued (NO in step S1030), the procedure returns to step S1002.

Upon determining in step S1030 that the estimation process is to be terminated (YES in step S1030), the estimation process is terminated.

<Summary>

As is understood from the descriptions provided heretofore, the temperature estimation apparatus 160 of the first embodiment is configured:

to perform a model generation process with respect to a time series model that correlates data values, in distinct time periods, of a time series process data group relating to conditions inside a chamber in which plasma processing is performed, with data values, at respective time points, of time series temperature data measured inside the chamber, thereby producing a generated time series model; and to successively input a new time series process data group relating to conditions inside the chamber into the generated time series model, thereby successively outputting estimated temperature data.

As described above, the first embodiment estimates temperature inside a chamber indirectly from a time series process data group, in consideration of the fact peculiar to a semiconductor manufacturing process, i.e., the fact that difficulties are encountered in permanently installing a temperature sensor inside a chamber for direct measurement of temperature. In so doing, the first embodiment uses data values, in distinct time periods, of a time series process data group relating to conditions inside the chamber, thereby estimating time series temperature data.

With this arrangement, the first embodiment can estimate temperature data responsive to changes in process data even when conditions inside the chamber have been changed.

Accordingly, the first embodiment provides a temperature estimation apparatus, a plasma processing system, a temperature estimation method, and a temperature estimation program which estimate temperature responsive to a change in conditions inside a processing space for plasma processing.

Second Embodiment

The first embodiment has been described with respect to a case in which the model generation unit 161 performs a model generation process with respect to an ARX model. Notwithstanding this, a time series model for which the model generation unit 161 performs a model generation purposes is not limited to an ARX model. For example, any other model (e.g., RNN (recurrent neural network) model) may be used as long as such a model can calculate correlation of time series data.

In the case of an RNN model, the model generation unit 161 determines model parameters by a learning process to produce a generated RNN model. Specifically, in the case of an RNN model, the model generation unit 161 uses a training data set comprised of a process data group for model generation purposes serving as input data and temperature data for model generation purposes serving as supervisory data to perform a learning process, thereby determining model parameters.

Namely, the model generation unit 161 functions as a training unit to perform a learning process based on error back propagation or the like such that output data upon inputting the input data into the RNN model approaches the supervisory data, thereby producing a generated RNN model.

The first embodiment has been described with respect to a case in which the recipe adjustment unit 930 generates adjusted recipes based on estimated temperature data. Alternatively, the recipe adjustment unit 930 may analyze dynamic events inside the chamber 120 based on estimated temperature data to calculate characteristic data for adjusting recipes. The characteristic data refers to C/D (i.e., critical dimension), E/R (etching rate), and the like, for example.

The first embodiment has been described with respect to a case in which the temperature adjustment unit 910 adjusts temperature inside the chamber 120 during a seasoning process. However, the adjustment of temperature inside the chamber 120 by the temperature adjustment unit 910 is not limited to during a seasoning process. For example, an adjustment may be made during plasma processing applied to an unprocessed wafer. The plasma processing referred to herein includes etching, deposition, asking, etc.

The first embodiment is configured such that the semiconductor manufacturing process and the temperature estimation apparatus 160 are separate from each other. Alternatively, at least some of the functions of the temperature estimation apparatus 160 may be realized in the semiconductor manufacturing process.

The first embodiment has been described with respect to a case in which one temperature estimation apparatus 160 performs the model generation phase and the estimation phase. Alternatively, the temperature estimation apparatus for performing the model generation phase and the temperature estimation apparatus for performing the estimation phase may be separately provided.

The first embodiment has been described with respect to a configuration in which the temperature estimation apparatus 160 for performing the estimation phase functions as the estimation unit 200, the detection unit 210, and the controller 220. Alternatively, the temperature estimation apparatus 160 for performing the estimation phase may be provided separately for each of the estimation unit 200, the detection unit 210, and the controller 220. In other words, a temperature estimation apparatus having the estimation unit 200, an alarm outputting apparatus having the detection unit 210, and a temperature control apparatus having the controller 220 may be separately provided.

The present invention is not limited to the configurations described in connection with the embodiments that have been described heretofore, or to the combinations of these configurations with other elements. Various variations and modifications may be made without departing from the scope of the present invention, and may be adopted according to applications.

Further, the present invention is not limited to these embodiments, but various variations and modifications may be made without departing from the scope of the present invention.

According to at least one embodiment, the disclosures herein provide a temperature estimation apparatus, a plasma processing system, a temperature estimation method, and a temperature estimation program which estimate temperature responsive to a change in conditions inside a processing space for plasma processing.

The present application is based on and claims priority to Japanese patent application No. 2020-148524 filed on Sep. 3, 2020 and Japanese patent application No. 2021-137303 filed on Aug. 25, 2021, with the Japanese Patent Office. The entire contents of these applications are hereby incorporated by reference.

What is claimed is:

1. A temperature estimation apparatus, the apparatus comprising:
   a memory; and
   one or more processing circuits coupled to the memory and configured to
      obtain time series process data relating to conditions inside a processing space in which plasma processing is performed;
      successively estimate temperature data by successively inputting the obtained time series process data into a time series model generated in advance that correlates data values, in each time period, of time series process data relating to conditions inside the processing space, with a data value, at a respective time point, of time series temperature data measured inside the processing space; and
      adjust a time length of the plasma processing or an amount of power of an RE power supply, prior to a start of the plasma processing or during the plasma processing, such that the successively estimated temperature data approach a target temperature.

2. The temperature estimation apparatus as claimed in claim 1, wherein the obtained time series process data relating to conditions inside the processing space are a plurality of kinds of time series process data measured by respective sensors.

3. The temperature estimation apparatus as claimed in claim 2, wherein the sensors include at least one of a sensor for measuring pressure inside the processing space, a sensor for measuring a flow rate of a gas supplied to the processing space, a sensor for measuring the amount of power of the RF power supply for plasma processing, a sensor for measuring a chamber impedance, and a sensor for measuring an amount of power of a heater for heating the processing space.

4. The temperature estimation apparatus as claimed in claim 2, wherein the obtained time series process data relating to conditions inside the processing space are a plurality of kinds of time series process data measured prior to the start of the plasma processing or during an execution of the plasma processing.

5. The temperature estimation apparatus as claimed in claim 2, wherein the time series model is configured to output currently estimated temperature data by adding together, after weighting with parameters of the time series model, process data in a predetermined time period, among the obtained time series process data, preceding current process data and previously estimated temperature data in a predetermined time period preceding the currently estimated temperature data.

6. The temperature estimation apparatus as claimed in claim 1, wherein the one or more processing circuits are further configured to produce the time series model by determining parameters of the time series model based on errors between data values, at time points, of time series temperature data measured in the processing space and temperature data successively output from the time series model upon successively inputting time series process data relating to conditions inside the processing space in which plasma processing is performed.

7. The temperature estimation apparatus as claimed in claim 6, wherein the one or more processing circuits are further configured to produce the time series model for a given measurement location by determining parameters of the time series model based on errors between data values, at time points, of time series temperature data measured at the given measurement location in the processing space and the temperature data successively output from the time series model.

8. The temperature estimation apparatus as claimed in claim 1, further comprising:
   an alarm outputting apparatus configured to output an alarm upon occurrence of an event that the successively estimated temperature data fall outside a predetermined temperature range.

9. A temperature control method, the method comprising:
   obtaining time series process data relating to conditions inside a processing space in which plasma processing is performed; and
   successively estimating temperature data by successively inputting the obtained time series process data into a time series model generated in advance that correlates data values, in each time periods, of time series process data relating to conditions inside the processing space, with a data value, at a respective time point, of time series temperature data measured inside the processing space; and adjusting a time length of the plasma processing or an amount of power of an RF power supply, prior to a start of the plasma processing or during the plasma processing, such that the successively estimated temperature data approach a target temperature.

10. A non-transitory computer-readable recording medium having a program embodied therein for causing a computer to perform:

obtaining time series process data relating to conditions inside a processing space in which plasma processing is performed; and successively estimating temperature data by successively inputting the obtained time series process data into a time series model generated in advance that correlates data values, in each time period, of time series process data relating to conditions inside the processing space, with a data value, at a respective time point, of time series temperature data measured inside the processing space; and adjusting a time length of the plasma processing or an amount of power of an RF power supply, prior to a start of the plasma processing or during the plasma processing, such that the successively estimated temperature data approach a target temperature.

* * * * *